: US009735186B2

United States Patent
Zhang

(10) Patent No.: US 9,735,186 B2
(45) Date of Patent: Aug. 15, 2017

(54) MANUFACTURING METHOD AND STRUCTURE THEREOF OF TFT BACKPLANE

(71) Applicant: Shenzhen China Star Optoelectronics Technology Co., Ltd., Shenzhen (CN)

(72) Inventor: Xiaoxing Zhang, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 142 days.

(21) Appl. No.: 14/781,309

(22) PCT Filed: Jul. 27, 2015

(86) PCT No.: PCT/CN2015/085154
§ 371 (c)(1),
(2) Date: Sep. 30, 2015

(87) PCT Pub. No.: WO2017/000335
PCT Pub. Date: Jan. 5, 2017

(65) Prior Publication Data
US 2017/0141137 A1 May 18, 2017

(30) Foreign Application Priority Data

Jul. 1, 2015 (CN) .......................... 2015 1 0379544

(51) Int. Cl.
H01L 27/12 (2006.01)
H01L 29/49 (2006.01)
H01L 29/786 (2006.01)

(52) U.S. Cl.
CPC ...... *H01L 27/1277* (2013.01); *H01L 27/1222* (2013.01); *H01L 27/1288* (2013.01); *H01L 29/4908* (2013.01); *H01L 29/78675* (2013.01)

(58) Field of Classification Search
None
See application file for complete search history.

(56) References Cited

U.S. PATENT DOCUMENTS

2004/0016924 A1* 1/2004 Yamada .............. H01L 29/4908 257/59
2006/0141685 A1* 6/2006 Kim .................... H01L 27/1214 438/149

* cited by examiner

*Primary Examiner* — Angel Roman
*Assistant Examiner* — Kevin Quinto
(74) *Attorney, Agent, or Firm* — Leong C. Lei

(57) ABSTRACT

The disclosure provides a manufacturing method and a structure thereof of a TFT backplane. In the manufacturing method of the TFT backplane, after a polysilicon layer (3') is formed by implanting a induced ion solid-phase crystallization into an amorphous silicon layer (3), patterning the polysilicon layer using a half-tone mask to form an island active layer (4), and at the same time, etching a upper layer portion (31) with more implanted induced ions located in the middle portion of the island active layer (4) to form a channel region, retaining the upper layer portion (31) with more implanted induced ions located in two sides of the island active layer (4) to form a source/drain contact region, it not only reduces the number of masks, but also saves a process only for implanting doped ion into the source/drain contact region, thereby simplifying the process and reducing production cost.

14 Claims, 6 Drawing Sheets

MANUFACTURING METHOD AND STRUCTURE THEREOF OF TFT BACKPLANE

BACKGROUND

Technical Field

The disclosure is related to display technology field, and more particular to a manufacturing method and a structure thereof of a TFT backplane.

Related Art

In display technology field, the flat panel display technology of a liquid crystal display (LCD) and organic light emitting diode display (OLED) and so on have been gradually replaced the CRT display. OLED has the advantages of self-luminous, low driving voltage, high luminous efficiency, short response time, high definition and contrast ratio, viewing angle of about 180°, wide usage temperature range, flexible display and large-area full color display. Thus OLED has been recognized as a display device with the most development potential.

OLED can be divided into the passive OLED (PMOLED) and active OLED (AMOLED) according to the drive types. AMOLED is a self-luminous component which is usually composed of a low temperature polysilicon (LTPS) TFT backplane and an electrical excitation light layer. Low temperature polysilicon has high electron mobility, stronger driving ability, and for the AMOLED, the use of low temperature polysilicon material has the advantages of high resolution, fast response, high brightness, high aperture ratio, low power consumption and so on.

The common processes for manufacturing the low temperature polysilicon are mainly the excimer laser annealing (ELA), solid phase crystallization (SPC) and so on, wherein, because the size can be increased easily and a cost advantage is higher, the SPC technique becomes a research hotspot. The SPC technique is divided into by way of directly heating and baking at a high temperature for a long time and by way of ion-induced. The way of ion-induced is adapted to implant the particular ion to induce an amorphous silicon layer.

The traditional manufacturing method of the TFT backplane based on the SPC technique generally includes the following steps of:

step 1, as shown in FIG. 1, providing a substrate 100, and depositing, in turn, a buffer layer 200 and a amorphous silicon (a-Si) layer 300 on the substrate 100;

step 2, as shown in FIG. 2, implanting an induced ion into the amorphous silicon (a-Si) layer 300 and performing a high-temperature baking, such that the amorphous silicon performs the crystallization rapidly to generate the polysilicon layer 300', wherein the upper layer portion 310 of the polysilicon layer 300' has more implanted induced ions and a lower layer portion 320 has a semiconductor layer with more pure polysilicon;

step 3, as shown in FIG. 3, etching the upper layer portion 310 of the polysilicon layer 300', and retaining a semiconductor layer 320 with more pure polysilicon;

step 4, as shown in FIG. 4, patterning the semiconductor layer 320 using one mask to form an island active layer 400;

step 5, as shown in FIG. 5, coating a photoresist and patterning the photoresist using one mask, and then making the photoresist pattern 500 as a shielding layer to implant a doped ion into the island active layer 400, such that two sides of the island active layer 400 with implanted doped ion forms a source/drain contact region 401, and a middle portion of the island active layer 400 with no implanted doped ion forms a channel region 402;

step 6, as shown in FIGS. 6 and 7, removing the photoresist pattern 500 and then forming, in turn, a gate insulation layer 700, a gate 800, a insulation layer between the layers 900 and a source/drain 1000, the source/drain 1000 contacts with a source/drain contact region 401, so as to achieve the manufacture of the low temperature polysilicon TFT backplane.

It shows that in the manufacturing method of the TFT backplane based on the SPC technique, after implanting the induced ion to make the amorphous silicon crystallization to form the polysilicon layer 300', it has to etch the upper layer portion 310 with more implanted induced ions to retain the semiconductor 320 with more pure polysilicon; then, it patterns the semiconductor 320 using one mask to form the island active layer 400; because of the need for forming the source/drain contact region 401, it is necessary to use one mask to form the photoresist pattern 500, and make the photoresist pattern 500 as the shielding layer to implant a doped ion into two sides of the island active layer 400, so as to form the source/drain contact region 401. This process not only needs a larger number of masks, but also requires two ion implantations, such that the production cost is higher.

SUMMARY

A purpose of the disclosure is to provide a manufacturing method of a TFT backplane, thereby simplifying the process and reducing production cost.

A further purpose of the disclosure is to provide a structure of a TFT backplane, which the process is simple and the production cost is lower.

In order to achieve the above object, firstly, the disclosure provides a manufacturing method of a TFT backplane, after a polysilicon layer is formed by implanting a induced ion solid-phase crystallization into an amorphous silicon layer, patterning the polysilicon layer using a half-tone mask to form an island active layer, and at the same time, etching a upper layer portion with more implanted induced ions located in the middle portion of the island active layer to form a channel region, retaining the upper layer portion with more implanted induced ions located in two sides of the island active layer to form a source/drain contact region.

The manufacturing method of the TFT backplane includes the following steps of:

step 1, providing a substrate, and depositing, in turn, a buffer layer and the amorphous silicon layer on the substrate;

step 2, implanting the induced ion into the amorphous silicon layer and the performing a high-temperature baking, such that the amorphous silicon performs the solid-phase crystallization rapidly to generate the polysilicon layer, wherein the upper layer portion of the polysilicon layer has more implanted induced ions and a lower layer portion has a semiconductor layer with more pure polysilicon;

step 3, patterning the polysilicon layer using a half-tone mask to form an island active layer, and at the same time, etching the upper layer portion in the middle portion of the island active layer to form a channel region, and retaining the upper layer portion located in two sides of the island active layer to form the source/drain contact region;

step 4, forming, in turn, a gate insulation layer, a gate, a insulation layer between the layers and a source/drain on the island active layer and the buffer layer, wherein the source/drain contacts with a source/drain contact region.

The substrate is a glass substrate.

The induced ion implanted into the amorphous silicon layer in the step 2 is boron ion or nickel ion.

The step 3 includes:

step 31, coating a photoresist layer on the upper layer portion of the polysilicon layer, performing a full exposure on a region of the photoresist layer except a region of the photoresist layer covered on the island active layer using the half-tone mask, performing a half exposure on a region of the photoresist layer covered on the channel region, performing no exposure on a region of the photoresist layer covered on the source/drain contact region, and forming a photoresist layer pattern;

step 32, etching the polysilicon layer which is not covered by the photoresist layer pattern to form the island active layer;

step 33, removing a half exposure portion in the photoresist layer pattern and then etching the exposed upper layer portion of the polysilicon layer to form the channel region;

step 34, removing no exposure portion in the photoresist layer pattern and retaining the upper layer portion of the polysilicon layer covered by no exposure portion in the photoresist layer pattern to form the source/drain region.

A material of the buffer layer, the gate insulation layer and the insulation layer between the layers is silicon nitride, silicon oxide, or a stacked combination of both.

A material of the gate and the source/drain is one or more stacked combination of molybdenum, titanium, aluminum, and copper.

The disclosure further provides a manufacturing method of a TFT backplane, after a polysilicon layer is formed by implanting a induced ion solid-phase crystallization into an amorphous silicon layer, patterning the polysilicon layer using a half-tone mask to form an island active layer, and at the same time, etching a upper layer portion with more implanted induced ions located in the middle portion of the island active layer to form a channel region, retaining the upper layer portion with more implanted induced ions located in two sides of the island active layer to form a source/drain contact region;

wherein, the following step includes:

step 1, providing a substrate, and depositing, in turn, a buffer layer and the amorphous silicon layer on the substrate;

step 2, implanting the induced ion into the amorphous silicon layer and the performing a high-temperature baking, such that the amorphous silicon performs the solid-phase crystallization rapidly to generate the polysilicon layer, wherein the upper layer portion of the polysilicon layer has with more implanted induced ions and a lower layer portion has a semiconductor layer with more pure polysilicon;

step 3, patterning the polysilicon layer using a half-tone mask to form an island active layer, and at the same time, etching the upper layer portion in the middle portion of the island active layer to form a channel region, and retaining the upper layer portion located in two sides of the island active layer to form the source/drain contact region;

step 4, forming, in turn, a gate insulation layer, a gate, a insulation layer between the layers and a source/drain on the island active layer and the buffer layer, wherein the source/drain contacts with a source/drain contact region;

wherein, the substrate is a glass substrate;

wherein, the induced ion implanted into the amorphous silicon layer in the step 2 is boron ion or nickel ion.

The disclosure further a structure of a TFT backplane, includes:

a substrate;

a buffer layer, disposed on the substrate;

an island active layer, disposed on the buffer layer, the island active layer is formed by patterning the polysilicon layer using a half-tone mask after a polysilicon layer is formed by implanting a induced ion solid-phase crystallization into an amorphous silicon layer, two sides of the island active layer is a convex shape, a middle portion of the island active layer is a concave shape; the two sides of the island active layer includes a upper layer portion with more implanted induced ion and a lower layer portion with more pure polysilicon serve as a semiconductor layer, the upper layer portion forms the source/drain contact region; the middle portion of the island active layer only comprises the lower layer portion for forming a channel region;

a gate insulation layer, a gate, a insulation layer between the layers and a source/drain is formed, in turn, on the island active layer and the buffer layer;

the source/drain contacts with a source/drain contact region.

The substrate is a glass substrate; a material of the buffer layer, the gate insulation layer and the insulation layer between the layers is silicon nitride, silicon oxide, or a stacked combination of both.

A material of the gate and the source/drain is one or more stacked combination of molybdenum, titanium, aluminum, and copper.

The beneficial efficiency of the disclosure is as follows. The disclosure provides the manufacturing method of the TFT backplane, after a polysilicon layer is formed by implanting a induced ion solid-phase crystallization into an amorphous silicon layer, patterning the polysilicon layer using a half-tone mask to form an island active layer, and at the same time, etching a upper layer portion with more implanted induced ions located in the middle portion of the island active layer to form a channel region, retaining the upper layer portion with more implanted induced ions located in two sides of the island active layer to form a source/drain contact region. It not only reduces the number of masks, but also saves a process for implanting doped ion into the source/drain contact region, thereby simplifying the process and reducing production cost. The disclosure further provides the structure of the TFT backplane, on which two sides of the island active layer is a convex shape and a middle portion of the island active layer is a concave shape, the two sides of the island active layer includes a upper layer portion with more implanted induced ions and a lower layer portion with more pure polysilicon serve as a semiconductor layer, the upper layer portion forms the source/drain contact region; the middle portion of the island active layer only comprises the lower layer portion for forming a channel region; for the TFT backplane, the process is simple and the production cost is lower.

In order to further understand the characteristics and technical contents of the disclosure, refer to the following detailed description of the disclosure is related with the accompanying drawings, but only with reference to the accompanying drawings and the description provided by, not intended to limit the disclosure.

BRIEF DESCRIPTION OF THE DRAWINGS

Below in conjunction with the accompanying drawings, the disclosure will be described in detail by specific embodiments, the disclosure will make technical and other benefits are obvious.

In drawings,

FIG. 14 is a schematic view of the structure of the TFT backplane according to the present invention.

DETAILED DESCRIPTION

To further illustrate the disclosure taken techniques and their effects, the following in connection with preferred embodiments of the disclosure and the accompanying drawings in detail.

Figure 1:
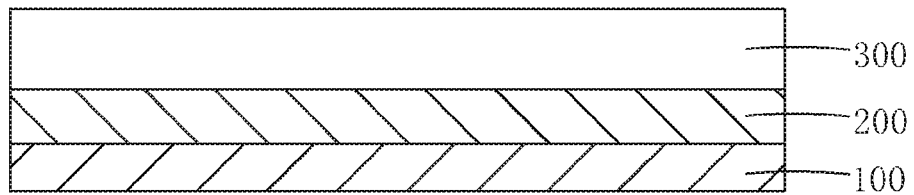
FIG. 1 is a schematic view of step 1 of the traditional manufacturing method of the TFT backplane based on SPEC technique.
Figure 2:
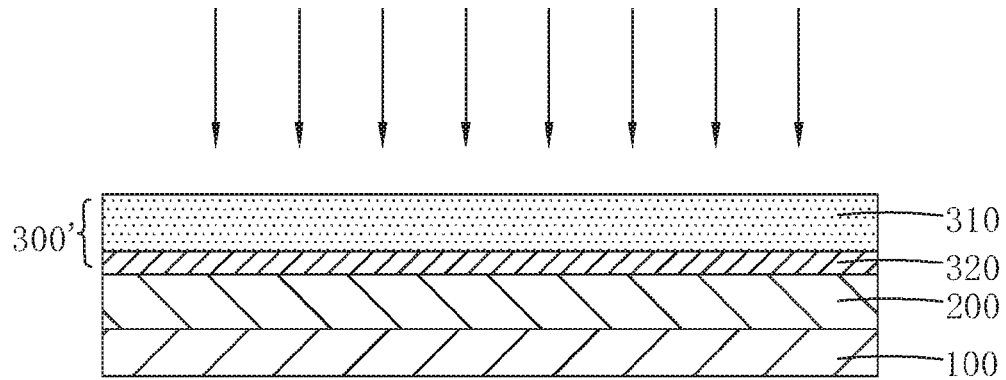
FIG. 2 is a schematic view of step 2 of the traditional manufacturing method of the TFT backplane based on SPEC technique.
Figure 3:
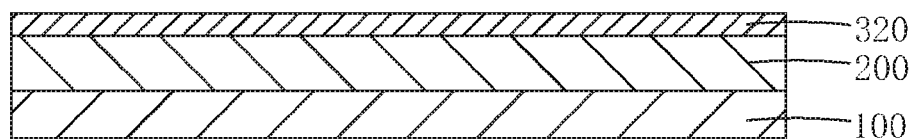
FIG. 3 is a schematic view of step 3 of the traditional manufacturing method of the TFT backplane based on SPEC technique.
Figure 4:
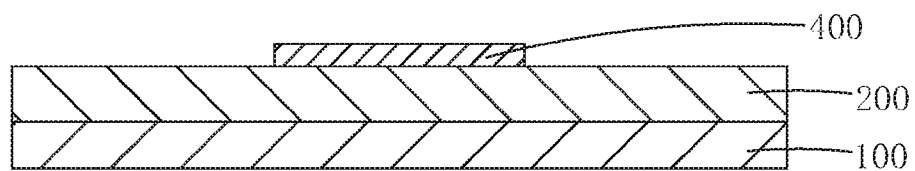
FIG. 4 is a schematic view of step 4 of the traditional manufacturing method of the TFT backplane based on SPEC technique.
Figure 5:
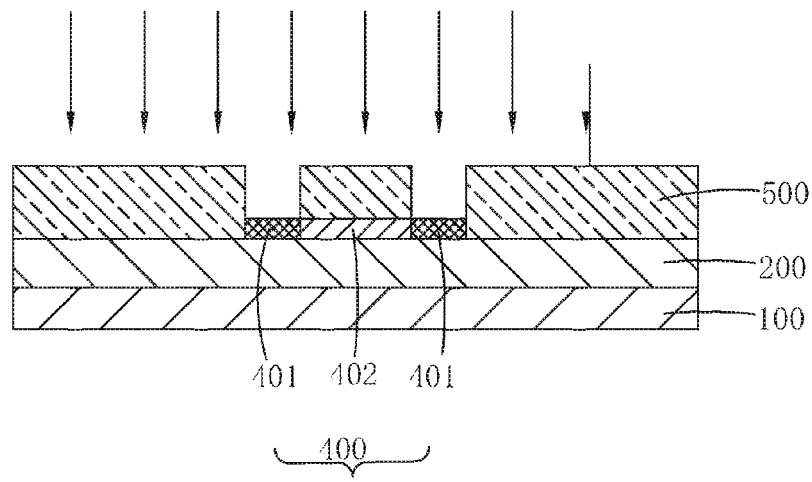
FIG. 5 is a schematic view of step 5 of the traditional manufacturing method of the TFT backplane based on SPEC technique.
Figure 6:
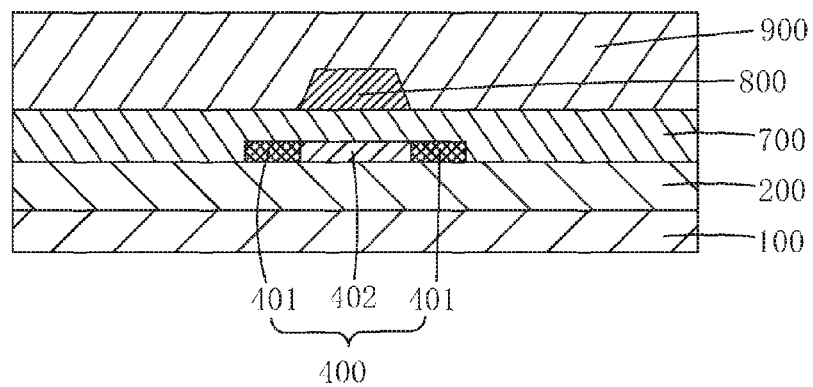
FIGS. 6 and 7 are a schematic view of step 6 of the traditional manufacturing method of the TFT backplane based on SPEC technique.
Figure 7:
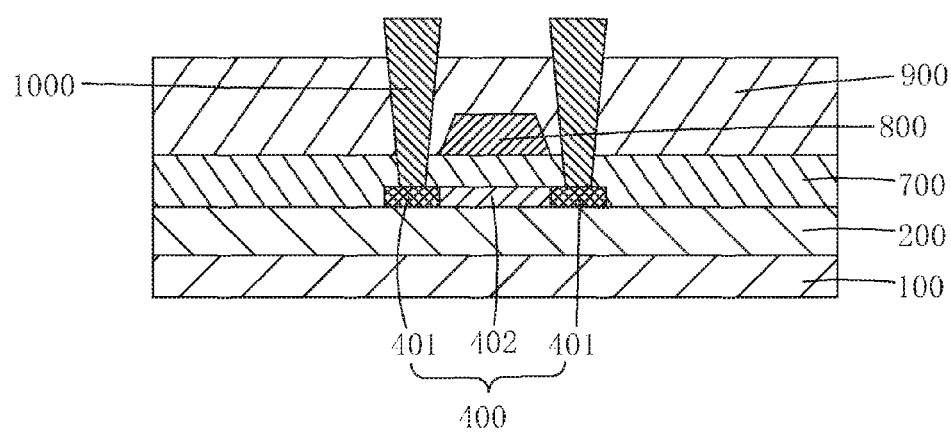
Figure 8:
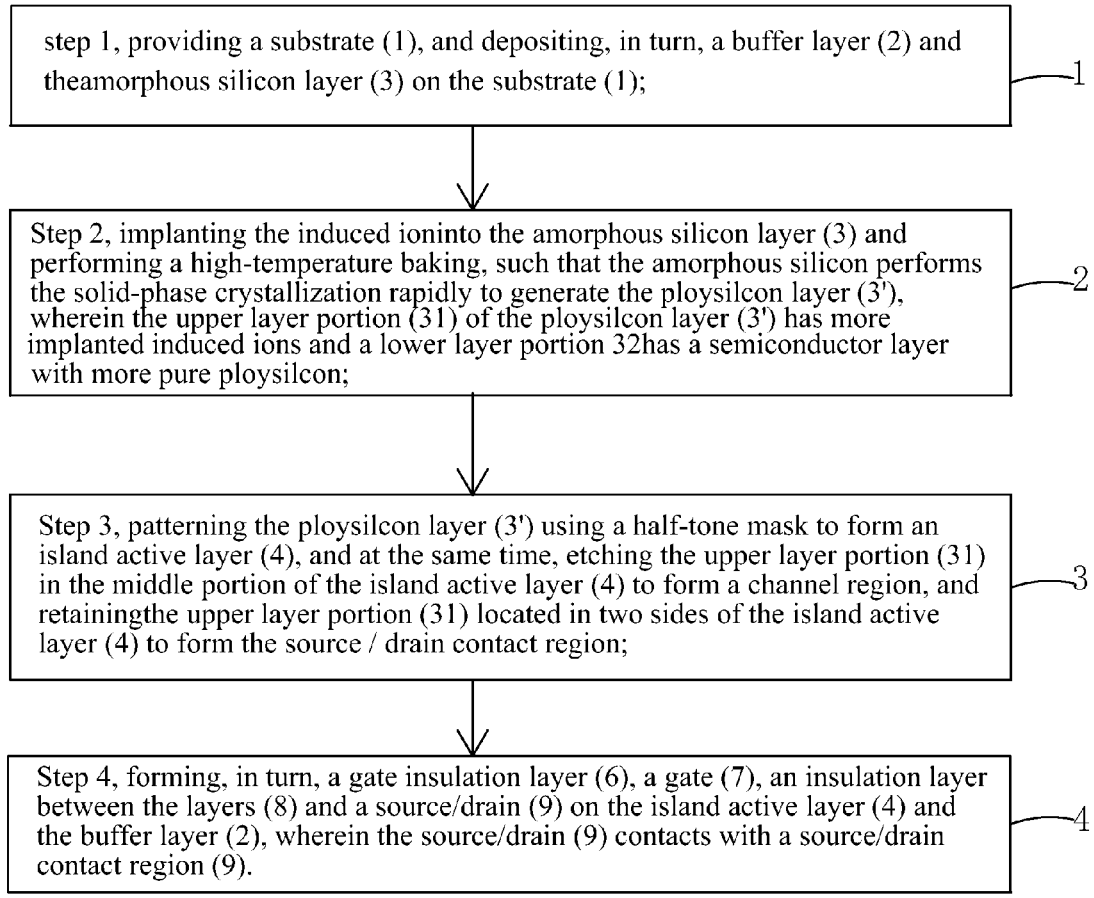
FIG. 8 is a flowchart of the manufacturing method of the TFT backplane according to the disclosure.
Figure 9:
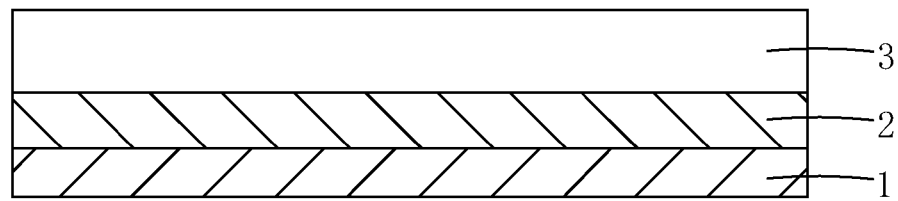
FIG. 9 is a schematic view of step 1 of the manufacturing method of the TFT backplane according to the disclosure.

Please refer to FIG. 8, firstly, the disclosure provides a manufacturing method of a TFT backplane, includes the following steps.

step 1, as shown in FIG. 9, providing a substrate 1, and depositing, in turn, a buffer layer 2 and the amorphous silicon layer 3 on the substrate 1.

Specifically, the substrate 1 is a transparent substrate, and preferably, the substrate 1 is a glass substrate.

A material of the buffer layer 2 is silicon nitride (SiNx), silicon oxide (SiOx), or a stacked combination of both.

Figure 10:
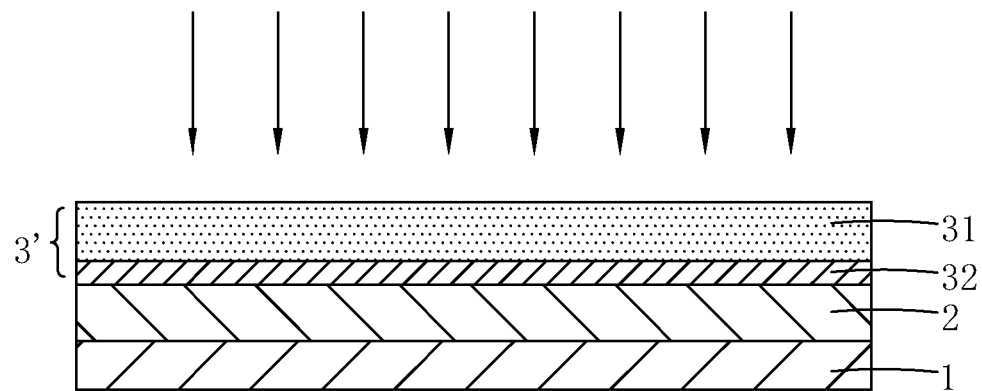
FIG. 10 is a schematic view of step 2 of the manufacturing method of the TFT backplane according to the disclosure.

Step 2, as shown in FIG. 10, implanting the induced ion into the amorphous silicon layer 3 and performing a high-temperature baking, such that the amorphous silicon performs the solid-phase crystallization rapidly to generate the polysilicon layer 3', wherein the upper layer portion 31 of the polysilicon layer 3' has more implanted induced ions and a lower layer portion 32 has a semiconductor layer with more pure polysilicon.

Specifically, the induced ion implanted into the amorphous silicon layer 3 in the step 2 is boron (B) ion or nickel (Ni) ion.

Figure 11:
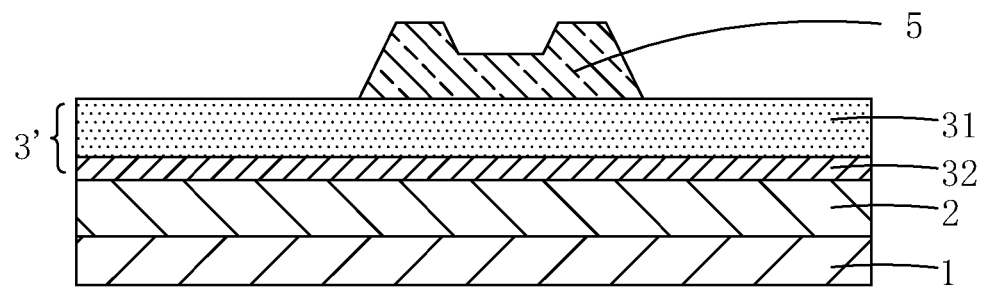
FIGS. 11 and 12 are a schematic view of step 3 of the manufacturing method of the TFT backplane according to the disclosure.
Figure 12:
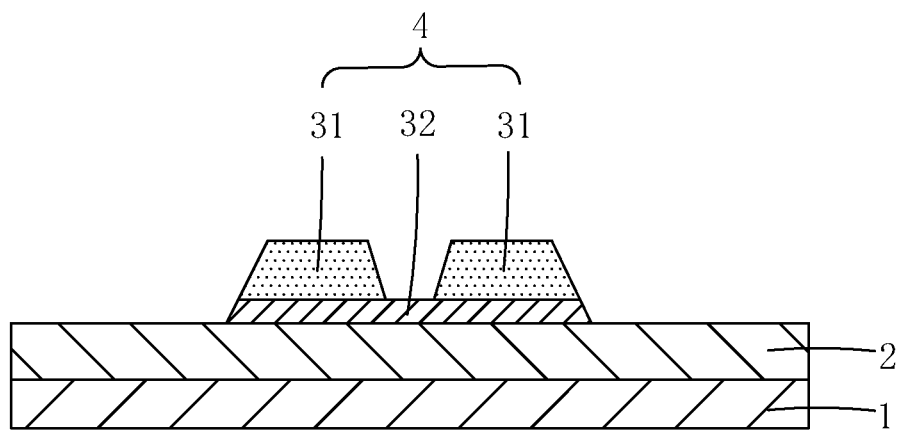

Step 3, as shown in FIGS. 11 and 12, patterning the polysilicon layer 3' using a half-tone mask to form an island active layer 4, and at the same time, etching the upper layer portion 31 in the middle portion of the island active layer 4 to form a channel region, and retaining the upper layer portion 31 located in two sides of the island active layer 4 to form the source/drain contact region.

Further, the step 3 includes:

step 31, coating a photoresist layer on the upper layer portion 31 of the polysilicon layer 3', performing a full exposure on a region of the photoresist layer except a region of the photoresist layer covered on the island active layer 4 using the half-tone mask, performing a half exposure on a region of the photoresist layer covered on the channel region, performing no exposure on a region of the photoresist layer covered on the source/drain contact region, and forming a photoresist layer pattern 5;

step 32, etching the polysilicon layer 3' which is not covered by the photoresist layer pattern 5 to form the island active layer 4;

step 33, removing a half exposure portion in the photoresist layer pattern 5 and then etching the exposed upper layer portion 31 of the polysilicon layer 3' to form the channel region;

step 34, removing no exposure portion in the photoresist layer pattern 5 and retaining the upper layer portion 31 of the polysilicon layer 3' covered by no exposure portion in the photoresist layer pattern 5 to form the source/drain region.

Figure 13:
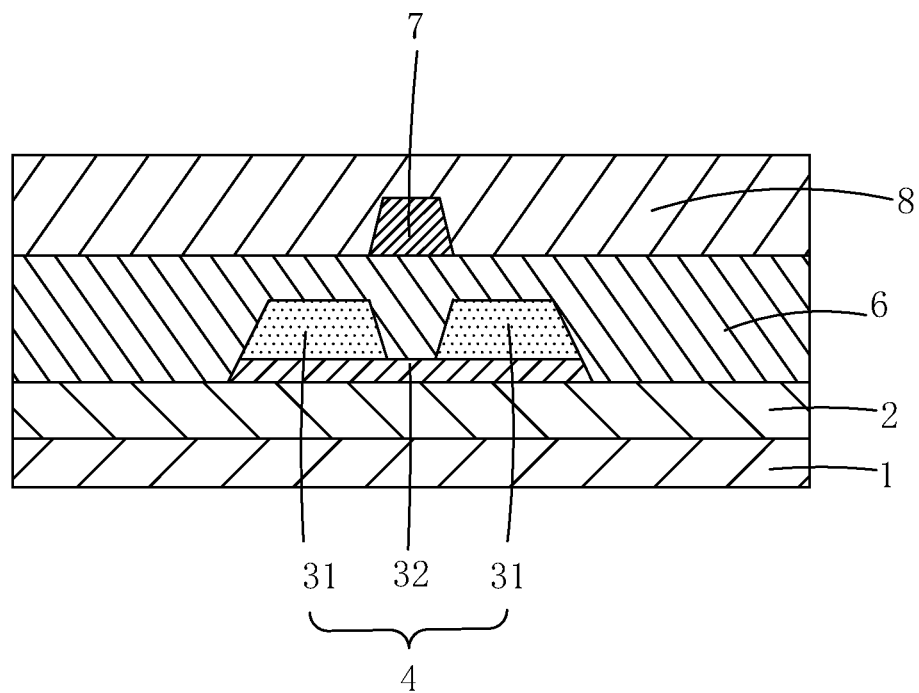
FIGS. 13 and 14 are a schematic view of step 4 of the manufacturing method of the TFT backplane according to the disclosure; meanwhile.
Figure 14:
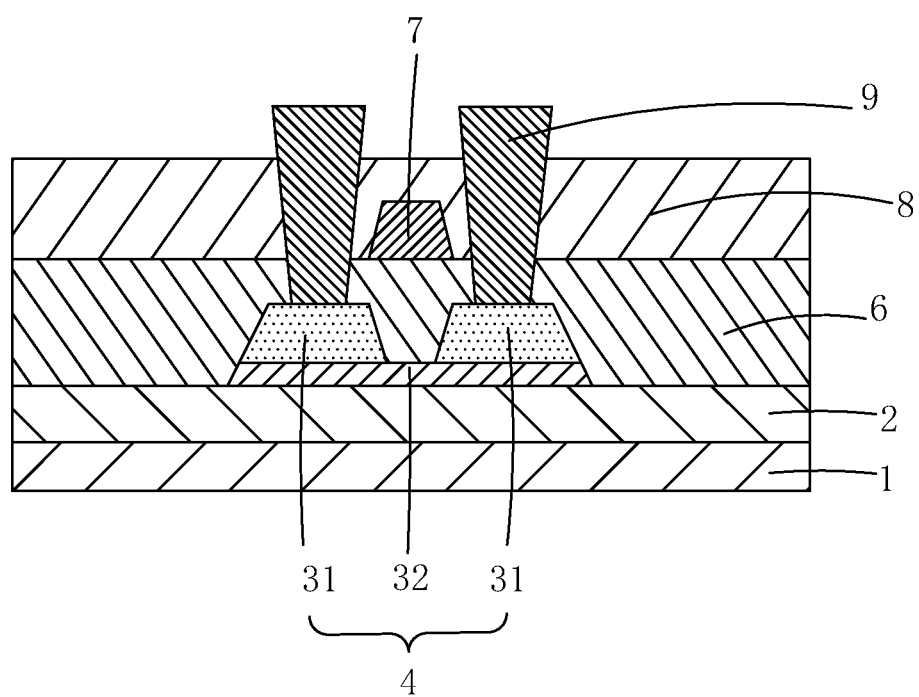

Step 4, as shown in FIGS. 13 and 14, forming, in turn, a gate insulation layer 6, a gate 7, a insulation layer between the layers 8 and a source/drain 9 on the island active layer 4 and the buffer layer 2, wherein the source/drain 9 contacts with a source/drain contact region 9.

Specifically, a material of the gate insulation layer 6 and the insulation layer between the layers 8 is SiNx, SiOx, or a stacked combination of both.

A material of the gate 7 and the source/drain 9 is one or more stacked combination of molybdenum (Mo), titanium (Ti), aluminum (Al), and copper (Cu).

In the manufacturing method of the TFT backplane of the disclosure, after a polysilicon layer 3' is formed by implanting a induced ion solid-phase crystallization into an amorphous silicon layer 3, the method comprises the steps of patterning the polysilicon layer 3' using a half-tone mask to form an island active layer 4, and at the same time, etching a upper layer portion 31 with more implanted induced ions located in the middle portion of the island active layer 4 to form a channel region, retaining the upper layer portion 31 with more implanted induced ions located in two sides of the island active layer 4 to form a source/drain contact region. The disclosure not only reduces the number of masks, but also saves a process only for implanting doped ion into the source/drain contact region, thereby simplifying the process and reducing production cost.

On the basis of the above manufacturing method of the TFT backplane, as shown in FIG. 14, the disclosure further provides a structure of a TFT backplane which includes:

a substrate 1;

a buffer layer 2 is disposed on the substrate 1;

an island active layer 4 is disposed on the buffer layer 2, the island active layer 4 is formed by patterning the polysilicon layer using a half-tone mask after a polysilicon layer is formed by implanting a induced ion solid-phase crystallization into an amorphous silicon layer, two sides of the island active layer 4 is a convex shape, a middle portion of the island active layer 4 is a concave shape; the two sides of the island active layer 4 comprises a upper layer portion 31 with more implanted induced ions and a lower layer portion 32 with more pure polysilicon serve as a semiconductor layer, the upper layer portion 31 forms the source/drain contact region; the middle portion of the island active layer 4 only comprises the lower layer portion 32 for forming a channel region;

a gate insulation layer 6, a gate 7, a insulation layer between the layers 8 and a source/drain 9 is formed, in turn, on the island active layer 4 and the buffer layer 2;

the source/drain 9 contacts with a source/drain contact region 42.

Specifically, the substrate 1 is a transparent substrate, and preferably, the substrate 1 is a glass substrate.

A material of the buffer layer 2, the gate insulation layer 6 and the insulation layer between the layers 8 is SiNx, SiOx, or a stacked combination of both.

A material of the gate 7 and the source/drain 9 is one or more stacked combination of Mo, Ti, Al, and Cu.

For the TFT backplane, the process is simple and the production cost is lower.

In summary, in the manufacturing method of the TFT backplane of the disclosure, after a polysilicon layer is formed by implanting a induced ion solid-phase crystallization into an amorphous silicon layer, the method comprises the steps of patterning the polysilicon layer using a half-tone mask to form an island active layer, and at the same time, etching a upper layer portion with more implanted induced ions located in the middle portion of the island active layer to form a channel region, retaining the upper layer portion with more implanted induced ions located in two sides of the island active layer to form a source/drain contact region. The disclosure not only reduces the number of masks, but also saves a process only for implanting doped ion into the source/drain contact region, thereby simplifying the process and reducing production cost. In the structure of the TFT backplane of the disclosure, two sides of the island active layer is a convex shape and a middle portion of the island active layer is a concave shape, the two sides of the island active layer includes a upper layer portion with more implanted induced ions and a lower layer portion with more pure polysilicon serve as a semiconductor layer, the upper layer portion forms the source/drain contact region; the middle portion of the island active layer only comprises the lower layer portion for forming a channel region; for the TFT backplane, the process is simple and the production cost is lower.

In summary, although the present disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A manufacturing method of a TFT backplane, after a polysilicon layer is formed by implanting an induced ion solid-phase crystallization into an amorphous silicon layer, patterning the polysilicon layer using a half-tone mask to form an island active layer, and at the same time, etching an upper layer portion with more implanted induced ions located in the middle portion of the island active layer to form a channel region, retaining the upper layer portion with more implanted induced ions located in two sides of the island active layer to form a source/drain contact region.

2. The manufacturing method of the TFT backplane according to claim 1, wherein comprising the following steps of:

step 1, providing a substrate, and depositing, in turn, a buffer layer and the amorphous silicon layer on the substrate;

step 2, implanting the induced ion into the amorphous silicon layer and then performing a high-temperature baking, such that the amorphous silicon performs the solid-phase crystallization rapidly to generate the polysilicon layer, wherein the upper layer portion of the polysilicon layer has more implanted induced ions and a lower layer portion has a semiconductor layer with more pure polysilicon;

step 3, patterning the polysilicon layer using a half-tone mask to form an island active layer, and at the same time, etching the upper layer portion in the middle portion of the island active layer to form a channel region, and retaining the upper layer portion located in two sides of the island active layer to form the source/drain contact region;

step 4, forming, in turn, a gate insulation layer, a gate, an insulation layer between the layers and a source/drain on the island active layer and the buffer layer, wherein the source/drain contacts with a source/drain contact region.

3. The manufacturing method of the TFT backplane according to claim 2, wherein the substrate is a glass substrate.

4. The manufacturing method of the TFT backplane according to claim 2, wherein the induced ion implanted into the amorphous silicon layer is boron ion or nickel ion.

5. The manufacturing method of the TFT backplane according to claim 2, wherein the step of patterning the polysilicon layer using a half-tone mask to form an island active layer, and at the same time, etching the upper layer portion in the middle portion of the island active layer to form a channel region, and retaining the upper layer portion located in two sides of the island active layer to form the source/drain contact region comprises:

step 31, coating a photoresist layer on the upper layer portion of the polysilicon layer, performing a full exposure on a region of the photoresist layer except a region of the photoresist layer covered on the island active layer using the half-tone mask, performing a half exposure on a region of the photoresist layer covered on the channel region, performing no exposure on a region of the photoresist layer covered on the source/drain contact region, and forming a photoresist layer pattern;

step 32, etching the polysilicon layer which is not covered by the photoresist layer pattern to form the island active layer;

step 33, removing a half exposure portion in the photoresist layer pattern and then etching the exposed upper layer portion of the polysilicon layer to form the channel region;

step 34, removing no exposure portion in the photoresist layer pattern and retaining the upper layer portion of the polysilicon layer covered by no exposure portion in the photoresist layer pattern to form the source/drain region.

6. The manufacturing method of the TFT backplane according to claim 2, wherein a material of the buffer layer, the gate insulation layer and the insulation layer between the layers is silicon nitride, silicon oxide, or a stacked combination of both.

7. The manufacturing method of the TFT backplane according to claim 2, wherein a material of the gate and the source/drain is one or more of molybdenum, titanium, aluminum, and copper.

8. A manufacturing method of a TFT backplane, after a polysilicon layer is formed by implanting an induced ion solid-phase crystallization into an amorphous silicon layer, patterning the polysilicon layer using a half-tone mask to form an island active layer, and at the same time, etching an upper layer portion with more implanted induced ions located in the middle portion of the island active layer to form a channel region, retaining the upper layer portion with more implanted induced ions located in two sides of the island active layer to form a source/drain contact region;

wherein, the following step comprises:

step 1, providing a substrate, and depositing, in turn, a buffer layer and the amorphous silicon layer on the substrate;

step 2, implanting the induced ion into the amorphous silicon layer and then performing a high-temperature baking, such that the amorphous silicon performs the solid-phase crystallization rapidly to generate the polysilicon layer, wherein the upper layer portion of the polysilicon layer has more implanted induced ions and a lower layer portion has a semiconductor layer with more pure polysilicon;

step 3, patterning the polysilicon layer using a half-tone mask to form an island active layer, and at the same time, etching the upper layer portion in the middle portion of the island active layer to form a channel region, and retaining the upper layer portion located in two sides of the island active layer to form the source/drain contact region;

step 4, forming, in turn, a gate insulation layer, a gate, an insulation layer between the layers and a source/drain on the island active layer and the buffer layer, wherein the source/drain contacts with a source/drain contact region;

wherein, the substrate is a glass substrate;

wherein, the induced ion implanted into the amorphous silicon layer is boron ion or nickel ion.

9. The manufacturing method of the TFT backplane according to claim 8, wherein the step of patterning the polysilicon layer using a half-tone mask to form an island active layer, and at the same time, etching the upper layer portion in the middle portion of the island active layer to form a channel region, and retaining the upper layer portion located in two sides of the island active layer to form the source/drain contact region comprises:

step 31, coating a photoresist layer on the upper layer portion of the polysilicon layer, performing a full exposure on a region of the photoresist layer except a region of the photoresist layer covered on the island active layer using the half-tone mask, performing a half exposure on a region of the photoresist layer covered on the channel region, performing no exposure on a region of the photoresist layer covered on the source/drain contact region, and forming a photoresist layer pattern;

step 32, etching the polysilicon layer which is not covered by the photoresist layer pattern to form the island active layer;

step 33, removing a half exposure portion in the photoresist layer pattern and then etching the exposed upper layer portion of the polysilicon layer to form the channel region;

step 34, removing no exposure portion in the photoresist layer pattern and retaining the upper layer portion of the polysilicon layer covered by no exposure portion in the photoresist layer pattern to form the source/drain region.

10. The manufacturing method of the TFT backplane according to claim 8, wherein a material of the buffer layer, the gate insulation layer and the insulation layer between the layers is silicon nitride, silicon oxide, or a stacked combination of both.

11. The manufacturing method of the TFT backplane according to claim 8, wherein a material of the gate and the source/drain is one or more of molybdenum, titanium, aluminum, and copper.

12. A structure of a TFT backplane, comprising:

a substrate;

a buffer layer, disposed on the substrate;

an island active layer, disposed on the buffer layer, wherein the island active layer is a patterned polysilicon layer and has two sides and a middle portion connecting the two sides, the island active layer comprises a lower layer portion at the two sides as well as the middle portion and an upper layer portion only at the two sides so that the island active layer is convex at the two sides but concave in the middle, the lower layer portion has more pure polysilicon than the upper layer portion and serves as a semiconductor layer, the upper layer portion has more ions than the lower layer portion, the upper layer portion forms a source/drain contact region, the middle portion of the island active layer only comprises the lower layer portion and forms a channel region;

a gate insulation layer, a gate, an insulation layer between the layers and a source/drain is formed, in turn, on the island active layer and the buffer layer;

the source/drain contacts with the source/drain contact region.

13. The structure of the TFT backplane according to claim 12, wherein the substrate is a glass substrate; a material of the buffer layer, the gate insulation layer and the insulation layer between the layers is silicon nitride, silicon oxide, or a stacked combination of both.

14. The structure of the TFT backplane according to claim 12, wherein a material of the gate and the source/drain is one or more of molybdenum, titanium, aluminum, and copper.

* * * * *